United States Patent
Lee et al.

(10) Patent No.: US 8,325,436 B2
(45) Date of Patent: Dec. 4, 2012

(54) INFORMATION STORAGE DEVICES USING MAGNETIC DOMAIN WALL MOVEMENT, METHODS OF OPERATING THE SAME, AND METHODS OF MANUFACTURING THE SAME

(75) Inventors: Chang-won Lee, Seoul (KR); Sun-ae Seo, Hwaseong-si (KR); Young-Jin Cho, Suwon-si (KR); Sung-chul Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 624 days.

(21) Appl. No.: 12/155,187

(22) Filed: May 30, 2008

(65) Prior Publication Data

US 2009/0180210 A1    Jul. 16, 2009

(30) Foreign Application Priority Data

Jan. 16, 2008    (KR) .................. 10-2008-0004906

(51) Int. Cl.
*G11B 5/02* (2006.01)
(52) U.S. Cl. ....................................................... 360/59
(58) Field of Classification Search ............... 360/59, 360/75, 77.03, 314; 369/13.08, 13.44, 13.54, 369/314, 13.14; 365/80; 428/800
See application file for complete search history.

(56) References Cited

U.S. PATENT DOCUMENTS

| | | | |
|---|---|---|---|
| 6,519,211 B1 * | 2/2003 | Murakami et al. | 369/13.08 |
| 6,614,731 B2 * | 9/2003 | Ishii | 369/13.54 |
| 6,788,624 B2 * | 9/2004 | Murakami et al. | 369/13.08 |
| 6,804,822 B2 * | 10/2004 | Sato et al. | 720/718 |
| 6,853,606 B2 * | 2/2005 | Murakami et al. | 369/13.44 |
| 6,970,379 B2 | 11/2005 | Parkin | |
| 7,110,327 B2 * | 9/2006 | Takao et al. | 369/13.14 |
| 7,161,876 B2 * | 1/2007 | Murakami et al. | 369/13.08 |
| 2008/0049352 A1 * | 2/2008 | Yamanaka et al. | 360/59 |
| 2008/0124578 A1 * | 5/2008 | Kim et al. | 428/800 |
| 2008/0137395 A1 * | 6/2008 | Hwang et al. | 365/80 |
| 2008/0291579 A1 * | 11/2008 | Uesugi et al. | 360/314 |
| 2009/0268599 A1 * | 10/2009 | Murakami | 369/275.4 |

FOREIGN PATENT DOCUMENTS

| | | |
|---|---|---|
| JP | 2001-189002 | 7/2001 |
| KR | 10-2002-0031160 | 4/2002 |

* cited by examiner

*Primary Examiner* — Fred Tzeng
(74) *Attorney, Agent, or Firm* — Harness, Dickey & Pierce, P.L.C.

(57) ABSTRACT

Information storage devices using magnetic domain wall movement, methods of operating the same, and methods of manufacturing the same are provided. An information storage device includes a first magnetic layer, a heating unit and a magnetic field applying unit. The heating unit heats a first region of the first magnetic layer. The magnetic field applying unit applies a magnetic field to the first region to form a magnetic domain. A wall of the magnetic domain is moved by a current applied to the first magnetic layer.

24 Claims, 11 Drawing Sheets

FIG. 8D

INFORMATION STORAGE DEVICES USING MAGNETIC DOMAIN WALL MOVEMENT, METHODS OF OPERATING THE SAME, AND METHODS OF MANUFACTURING THE SAME

PRIORITY STATEMENT

This application claims priority under 35 U.S.C. §119 to Korean Patent Application No. 10-2008-0004906, filed on Jan. 16, 2008, in the Korean Intellectual Property Office, the entire contents of which is incorporated herein by reference.

BACKGROUND

Description of the Related Art

Nonvolatile information storage devices such as a hard disk drive (HDD) and a nonvolatile random access memory (RAM) retain recorded information even when power is cut off.

Conventional HDDs store recorded information using a rotating part. But, the rotating part may wear down over time. Wearing of the rotating part increases the possibility of operational failure, which reduces reliability.

An example of non-volatile RAM is a flash memory. Unlike conventional HDDs, conventional flash memories do not utilize a rotating part. But, conventional flash memories have relatively slow reading and writing speeds, relatively short life spans, and relatively small storage capacities as compared to conventional HDDs. Conventional flash memories also have relatively high manufacturing costs.

Another conventional nonvolatile information storage device uses principles of magnetic domain wall movement of a magnetic material. In these conventional magnetic memory devices, a minute magnetic region—a ferromagnetic substance—is referred to as a magnetic domain. A boundary portion between magnetic domains having different magnetization directions is referred to as a magnetic domain wall. Such magnetic domain walls have a given volume and may be moved by a current or an external magnetic field applied to a magnetic layer.

Conventional writing methods for conventional information storage devices using magnetic domain wall movement (hereinafter, conventional writing methods) include writing methods using a fringe field and writing methods using a spin torque phenomenon of electrons.

Writing methods using a fringe field are limited in that the writing method cannot be applied to information storage devices including a magnetic layer having a relatively large magnetic anisotropic energy. Accordingly, implementing an information storage device having improved characteristic and a relatively high recording density using the fringe field writing method may be relatively difficult.

When using the spin torque writing method, if the thickness of a magnetic layer on which data is to be recorded increases by about 3 nm or more, the requisite write voltage increases and writing is relatively difficult. As such, applying the spin torque writing method to a horizontal magnetic recording method requiring a magnetic layer having the thickness of about 20 nm-100 nm or greater may be relatively difficult.

SUMMARY

Example embodiments relate to information storage devices, methods of operating the same, and methods of manufacturing the same, for example, an information storage device using magnetic domain wall movement, a method of operating the same, and a method of manufacturing the same.

At least one example embodiment provides an information storage device. According to at least this example embodiment, a heating unit may be configured to heat a first region of a first magnetic layer. A magnetic field applying unit may be configured to apply a magnetic field to the first region to form a magnetic domain. A wall of the magnetic domain may be moved by applying a current to the first magnetic layer.

According to at least some example embodiments, the first magnetic layer may have perpendicular magnetic anisotropy. The first magnetic layer may be a hard magnetic layer. The heating unit may be a light source that radiates light on the first region. The information storage device may further include a light shielding wall. The light shielding wall may be arranged between the light source and the first region of the first magnetic layer. The light shielding wall may shield a portion of the light emitted from the light source. The portion of the light may be laterally-emitted light from the light source. The light source may be a laser diode (LD), a light emitting diode (LED) or the like. The first region may be one end of the first magnetic layer. The magnetic field applying unit may be a conductive line contacting a side surface of the first region. In this example, the information storage device may further include an electrode connected to the other end of the first magnetic layer. The current for moving the wall of the magnetic domain may be applied to the first magnetic layer through the conductive line and the electrode.

According to at least some example embodiments, the magnetic field applying unit may be a conductive line spaced apart from the one end. In this example, the information storage device may further include electrodes connected to each end of the first magnetic layer. The current for moving the wall of the magnetic domain may be applied to the first magnetic layer through the electrodes. According to at least some example embodiments, the conductive line may be perpendicular or substantially perpendicular to the first magnetic layer. A magnetic field generated by the conductive line may be applied perpendicular to the first magnetic layer.

According to at least some example embodiments, the information storage device may further include at least one second magnetic layer connected to the first magnetic layer. The at least one second magnetic layer may store information. The information storage device may further include a read unit configured to read information recorded in the second magnetic layer.

At least one other example embodiment provides a method of operating an information storage device. The information storage device may include a heating unit configured to heat a first region of a first magnetic layer, and a magnetic field applying unit configured to apply a magnetic field to the first region to form a magnetic domain. According to at least this example embodiment, the first region may be heated by the heating unit. A magnetic field may be applied to the heated first region using the magnetic field applying unit to form a magnetic domain.

According to at least some example embodiments, the wall of the magnetic domain may be moved by applying a current to the first magnetic layer. The information storage device may further include at least one second magnetic layer connected to the first magnetic layer. The at least one second magnetic layer may be configured to store information. The information storage device may further include a read unit configured to read information recorded in the second magnetic layer.

According to at least some example embodiments, a magnetic domain of the first magnetic layer contacting the second magnetic layer may be expanded by applying a current from the second magnetic layer to the first magnetic layer. After the expanding of the magnetic domain of the first magnetic layer, the wall of the magnetic domain may be moved within the first magnetic layer.

At least one other example embodiment provides a method of manufacturing an information storage device. According to at least this example embodiment, a light source may be formed on a substrate. A transparent insulating layer pattern may be formed on the light source. A light shielding wall may be formed to surround a side surface of the transparent insulating layer pattern. A first magnetic layer may be formed on the transparent insulating layer. The light shielding wall may be formed to at least partially surround the light source.

BRIEF DESCRIPTION OF THE DRAWINGS

Example embodiments will become more apparent by describing in detail the attached drawings in which.

DETAILED DESCRIPTION OF EXAMPLE EMBODIMENTS

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, example embodiments will be described in detail with reference to the attached drawings. In the description, the detailed descriptions of well-known functions and structures have been omitted so as not to hinder the understanding of the present invention.

Like reference numerals in the drawings denote like elements, and the sizes of elements in the drawings are exaggerated for clarity and explanatory conveniences.

Figure 1:
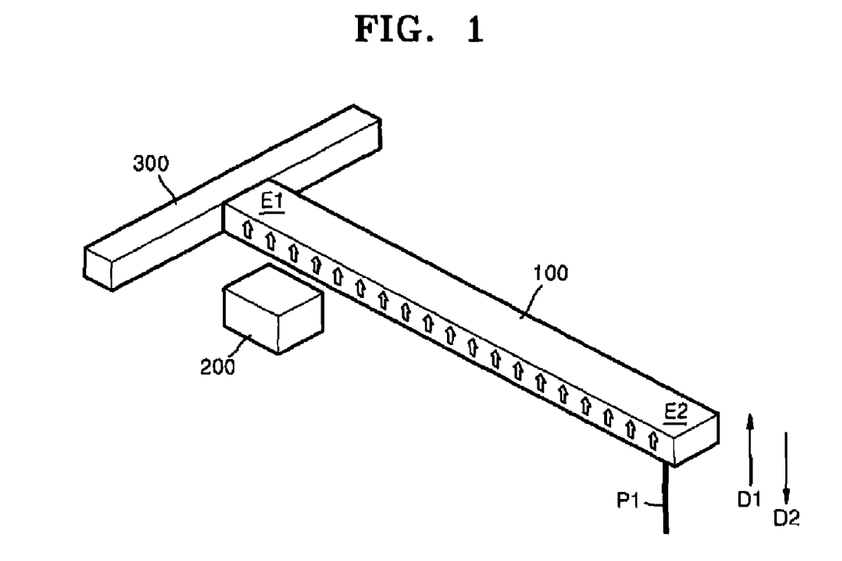
FIG. 1 is a perspective view of an information storage device using magnetic domain wall movement according to an example embodiment.

FIG. 1 illustrates an information storage device using magnetic domain wall movement according to an example embodiment.

Referring to FIG. 1, a first magnetic layer 100 may extend in a given direction. The first magnetic layer 100 may be a hard magnetic layer having perpendicular magnetic anisotropy. In one example, the first magnetic layer 100 may have a single or multi-layer structure. The multi-layer structure may include a first layer and a second layer stacked alternately. The first layer may be formed of at least one of Co, Co alloy, or the like. The second layer may be formed of at least one of Pt, Ni, Pd, an alloy thereof or the like. Alternatively, the first magnetic layer 100 may include a FePt layer, a CoPt layer, or similar layer, having an $L1_0$ (or similar) structure. Although the first magnetic layer 100 having all regions magnetized in a first direction D1 is shown in FIG. 1, a portion region of the first magnetic layer 100 may be magnetized in a second direction D2. The second direction D2 may be opposite to the first direction D1. Arrows shown in the first magnetic layer 100 denote magnetization directions of the first magnetic layer 100.

A heating unit 200 may be provided under a first region of the first magnetic layer 100. The first region may be an end E1 of the first magnetic layer 100. The heating unit 200 may heat the end E1 of the first magnetic layer 100. For example, the heating unit 200 may be a light source such as a laser diode (LD), light emitting diode (LED), or the like. The heating unit 200 may be spaced apart from the end E1 of the first magnetic layer 100. A light shielding wall (not shown) having a rectangular frame or similar shape may be provided between the heating unit 200 and the end E1 of the first magnetic layer 100. A transparent insulating material may fill the space between the heating unit 200 and the first magnetic layer 100 within the light shielding wall.

A conductive line 300 may contact a side surface of the end E1 of the first magnetic layer 100. The conductive line 300 may be perpendicular or substantially perpendicular to the first magnetic layer 100. The conductive line 300 may extend to each side of the first magnetic layer 100. The conductive line 300 may be a magnetic field applying unit for applying a magnetic field to the end E1 of the first magnetic layer 100. The magnetic field generated by the conductive line 300 form a magnetic domain on the end E1. The magnetic field generated by the conductive line 300 may be applied to the first magnetic layer 100 perpendicular thereto.

An electrode P1 may contact the other end E2 of the first magnetic layer 100. The electrode P1 may be plug-shaped or may be connected to a given driving device (not shown), for example, a transistor, a diode, or the like. Another driving device (not shown) similar or substantially similar to the driving device may also be connected to the conductive line 300. The conductive line 300, the electrode P1, and the driving device connected to each of the conductive line 300 and the electrode P1 may constitute a current applying unit. Alternatively, the conductive line 300, the electrode P1, and the driving device connecting the conductive line 300 and the electrode P1 may constitute the current applying unit for applying a current for magnetic domain wall movement.

According to at least one example embodiment, a current in a given direction may be applied to the first magnetic layer 100 through the conductive wire 300 and the electrode P1 so that a magnetic domain wall of the first magnetic layer 100 may be moved in a given direction. The direction of the current is opposite to the direction of electrons, and the magnetic domain may move in the same direction as the electrons. Thus, the magnetic domain wall of the first magnetic layer 100 may move in a direction opposite to the direction of the current.

Figure 2A:
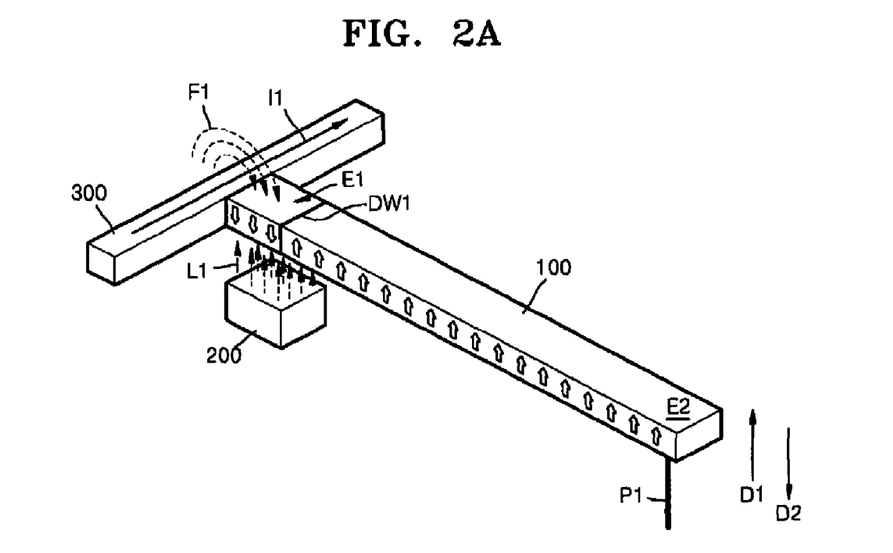
FIGS. 2A and 2B are perspective views for illustrating a method of operating an information storage device according to an example embodiment.
Figure 2B:
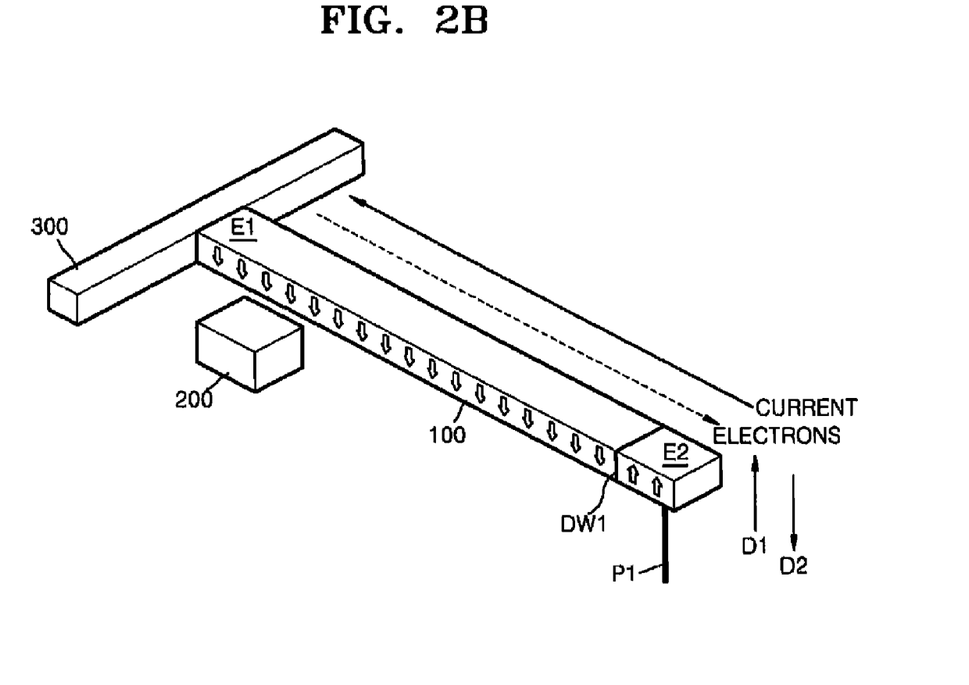

FIGS. 2A and 2B are perspective views for illustrating a method of operating an information storage device according to an example embodiment. The method shown in FIGS. 2A and 2B may be used to operate the information storage device of FIG. 1. In FIGS. 1, 2A and 2B, like reference characters represent like components.

Referring to FIG. 2A, end E1 of a first magnetic layer 100 may be heated using a heating unit 200. When the heating unit 200 is a light source, for example, the heating unit 200 may radiate light L1 onto the end E1 of the first magnetic layer 100 to heat the end E1. While the end E1 of the first magnetic layer 100 is heated or after the end E1 reaches or is greater than a given temperature, a current 11 may be applied to a conductive line 300 to generate a magnetic field F1. A magnetic field F1 may be generated according to the right hand screw rule and may be applied to the end E1 of the first magnetic layer 100 in a second direction D2. Thus, the magnetization direction of the end E1 of the first magnetic layer 100 may be inverted by the magnetic field F1 to the second direction D2. Accordingly, a given magnetic domain may be formed on the end E1 of the first magnetic layer 100 so that a first magnetic domain wall DW1 may be formed between the end E1 of the first magnetic layer 100 and the other region of the first magnetic layer 100.

In this example, after the end E1 of the first magnetic layer 100 is heated, the magnetization direction of the one end E1 may be inverted using the conductive line 300. As the end E1 of the first magnetic layer 100 is heated, the coercive force of the end E1 of the first magnetic layer 100 may be reduced. Thus, the intensity of a magnetic field needed to magnetize the end E1 of the first magnetic layer 100 in a given direction may be reduced. Although the first magnetic layer 100 is a layer formed of a hard magnetic material having perpendicular magnetic anisotropy, a magnetic domain and a magnetic domain wall may be formed in the first magnetic layer 100 more easily.

When the heating unit 200 is a light source, light may be concentrated on a first region of the first magnetic layer 100 and the temperature of the partial region may be selectively and/or more easily increased. If the heating unit 200 is a resistive conductive wire, heat generated in the resistive conductive wire may be spread in all or substantially all directions so that concentration of light on the first region of the first magnetic layer 100 is less likely.

Referring to FIG. 2B, the first magnetic domain wall DW1 may be moved in response to a current applied to the first magnetic layer 100. In this example, the current may be applied from the end E2 to the end E1 of the first magnetic layer 100. As such, electrons may flow from end E1 to end E2 of the first magnetic layer 100. The first magnetic domain wall DW1 may move to the end E2 according to the movement direction of the electrons. The movement distance of the first magnetic domain wall DW1 may be adjusted according to the intensity of the applied current and application time. Another current may be applied from the end E1 to the end E2 of the first magnetic layer 100 so that the first magnetic domain wall DW1 moves to the end E1 of the first magnetic layer 100. If necessary, the end E1 of the first magnetic layer 100 may be magnetized in the first direction D1 using the heating unit 200 and the conductive line 300 before the first magnetic domain wall DW1 moves to the end E1 of the first magnetic layer 100.

Figure 3:
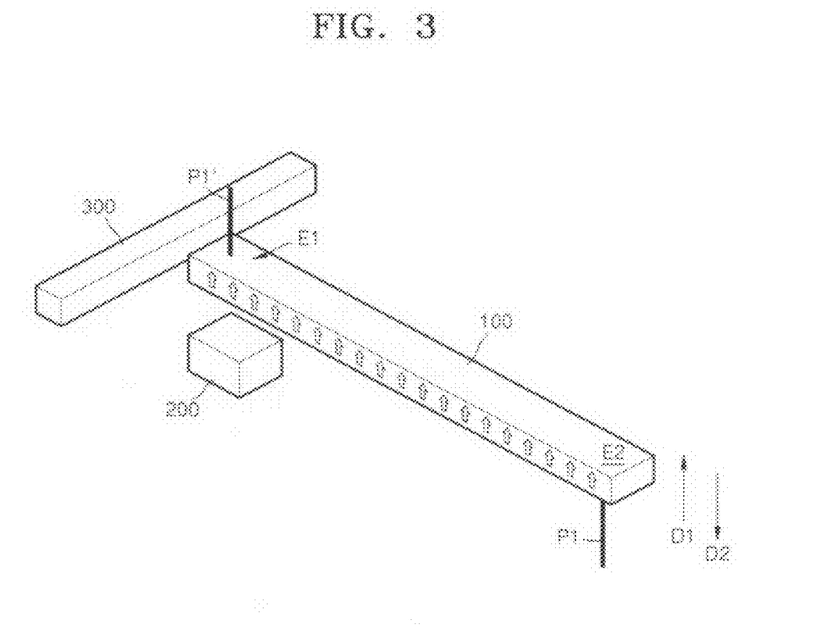
FIG. 3 is a perspective view of an information storage device using magnetic domain wall movement according to another example embodiment.

FIG. 3 is a perspective view of an information storage device using magnetic domain wall movement according to another example embodiment. This example embodiment may be similar or substantially similar to the example embodiment shown in FIG. 1. A detailed description of like elements will be omitted.

Referring to FIG. 3, according to at least this example embodiment, conductive line 300 may be spaced apart from the end E1 of a first magnetic layer 100. Although the conductive line 300 is spaced apart from the first magnetic layer 100, an end E1 heated by a heating unit 200 may be magnetized in a given direction by a magnetic field generated by the conductive line 300. A distance between the conductive line 300 and the end E1 may be, for example, several nm to several tens of nm. When the first conductive line 300 is spaced apart from the end E1 of the first magnetic layer 100, the conductive line 300 may be unable to apply a current to the first magnetic layer 100. Thus, another electrode P1' contacting the end E1 of the first magnetic layer 100 may be provided. A current for magnetic domain wall movement may be applied to the first magnetic layer 100 through the electrodes P1 and P1'.

Figure 4:
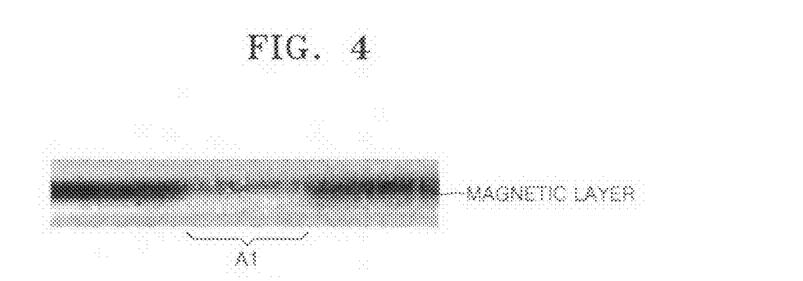
FIG. 4 is a photographic image showing a magnetic layer having a middle portion including a selectively inverted magnetization direction according to an example embodiment.

FIG. 4 is a photographic image showing a magnetic layer having a middle portion with a selectively-inverted magnetization direction according to an example embodiment. To obtain the resultant structure of FIG. 4, after radiating laser on the middle portion A1 of the magnetic layer magnetized in a given direction as so to heat the middle portion A1, a weak inversion magnetic field may be applied to the magnetic layer.

Referring to FIG. 4, the brightness of the middle portion A1 and the other part of the magnetic layer may be contrastive. In this example, only the magnetization direction of the heated middle portion A1 of the magnetic layer may be selectively inverted.

In the structures of FIGS. 1 and 3, the heating unit 200 and the conductive line 300 may constitute a write unit for forming a magnetic domain on the first magnetic layer 100. However, the structure of FIG. 1 or 3 may be a write unit for writing information on another magnetic layer, which will be described in more detail with reference to FIGS. 5 through 7.

Figure 5:
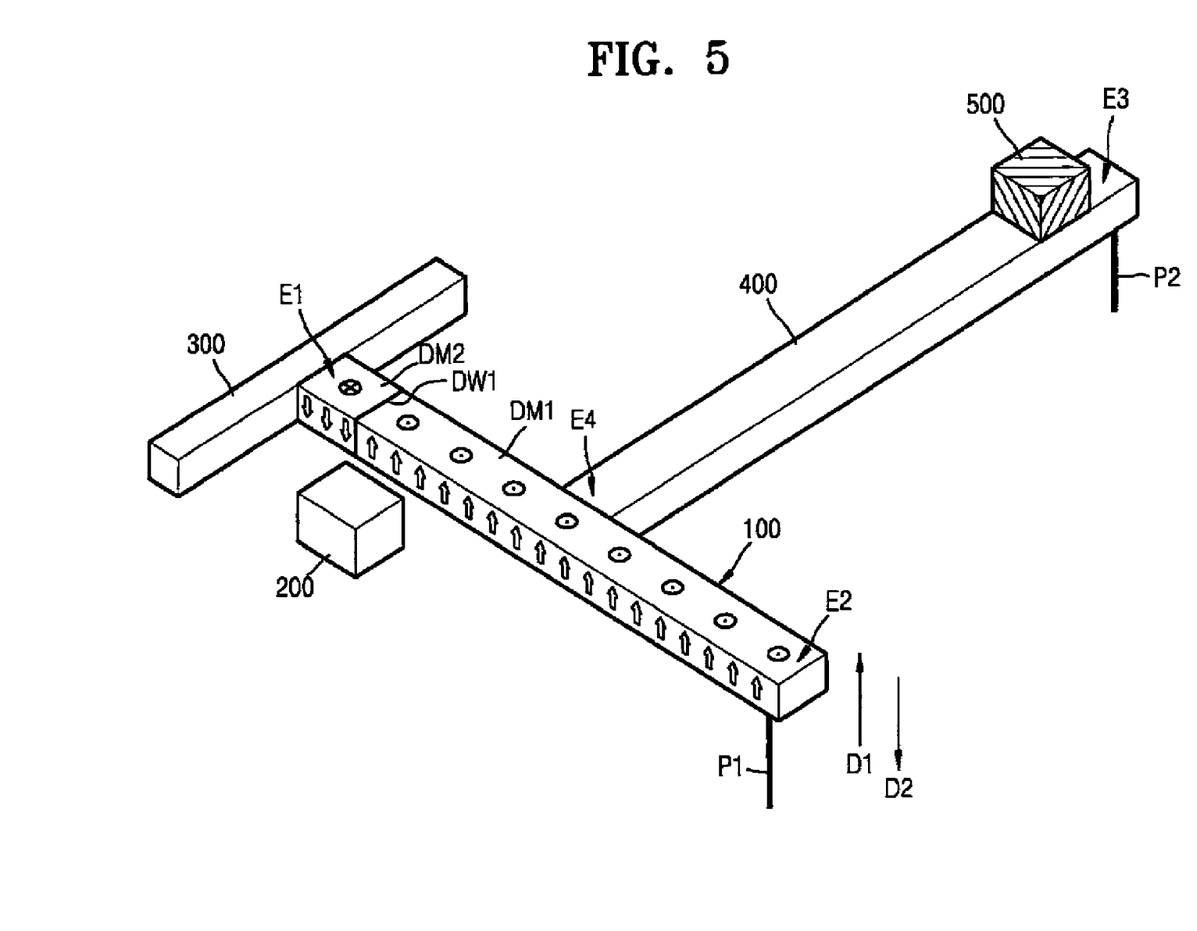
FIG. 5 is a perspective view of an information storage device using magnetic domain wall movement according to another example embodiment.

FIG. 5 is a perspective view of an information storage device using magnetic domain wall movement according to another example embodiment.

Referring to FIG. 5, an end E1 of a first magnetic layer 100 may be magnetized in a second direction D2 using the method described above with regard to FIG. 2A. A first magnetic domain wall DW1 may be arranged or disposed between the end E1 and the other region of the first magnetic layer 100. In FIG. 5, reference numerals DM1 and DM2 denote a first magnetic domain DM1 magnetized in a first direction D1 and a second magnetic domain DM2 magnetized in the second direction D2, respectively. As discussed herein, symbol ⊙ indicates that the first magnetic layer 100 is magnetized in the first direction D1 and symbol ⊗ indicates that the first magnetic layer 100 is magnetized in the second direction D2. These symbols are used in the same or substantially the same sense in the other drawings. Hereinafter, an electrode P1 arranged at the other end E2 of the first magnetic layer 100 is referred to as a first electrode P1.

A second magnetic layer 400 for storing information may be formed on at least one side surface of the first magnetic layer 100. The second magnetic layer 400 may be formed of the same or substantially the same material as the first magnetic layer 100. A notch, which is a pinning site of a magnetic domain wall, may be provided on a side surface of the second magnetic layer 400. A second electrode P2 may be provided at end E3 of the second magnetic layer 400. In this example, the end E3 of the second magnetic layer 400 is an end portion of the second magnetic layer 400. The end E3 may be the end portion of the second magnetic layer 400 opposite to an end at which the first magnetic layer 100 is formed. Thus, the end E3 may be spaced apart from the first magnetic layer 100. Reference numeral E4 denotes another end of the second magnetic layer 400. The end E4 may contact the first magnetic layer 100.

A read unit 500 for reproducing stored information may be provided at a given region of the second magnetic layer 400. The read unit 500 may be a giant magneto resistance (GMR) sensor using a GMR effect or a tunnel magneto resistance (TMR) sensor using a TMR sensor. The GMR sensor and the TMR sensor are well-known, and thus, a detailed description thereof will be omitted. The read unit 500 is not limited to the GMR and TMR sensors and may be modified in various ways. In addition, a position at which the read unit 500 is arranged may be changed.

FIGS. 6A through 6D are perspective views for illustrating a method of operating the information storage device according to another example embodiment. The method shown in FIGS. 6A through 6D may be used to operate the information storage device of FIG. 5.

Figure 6A:
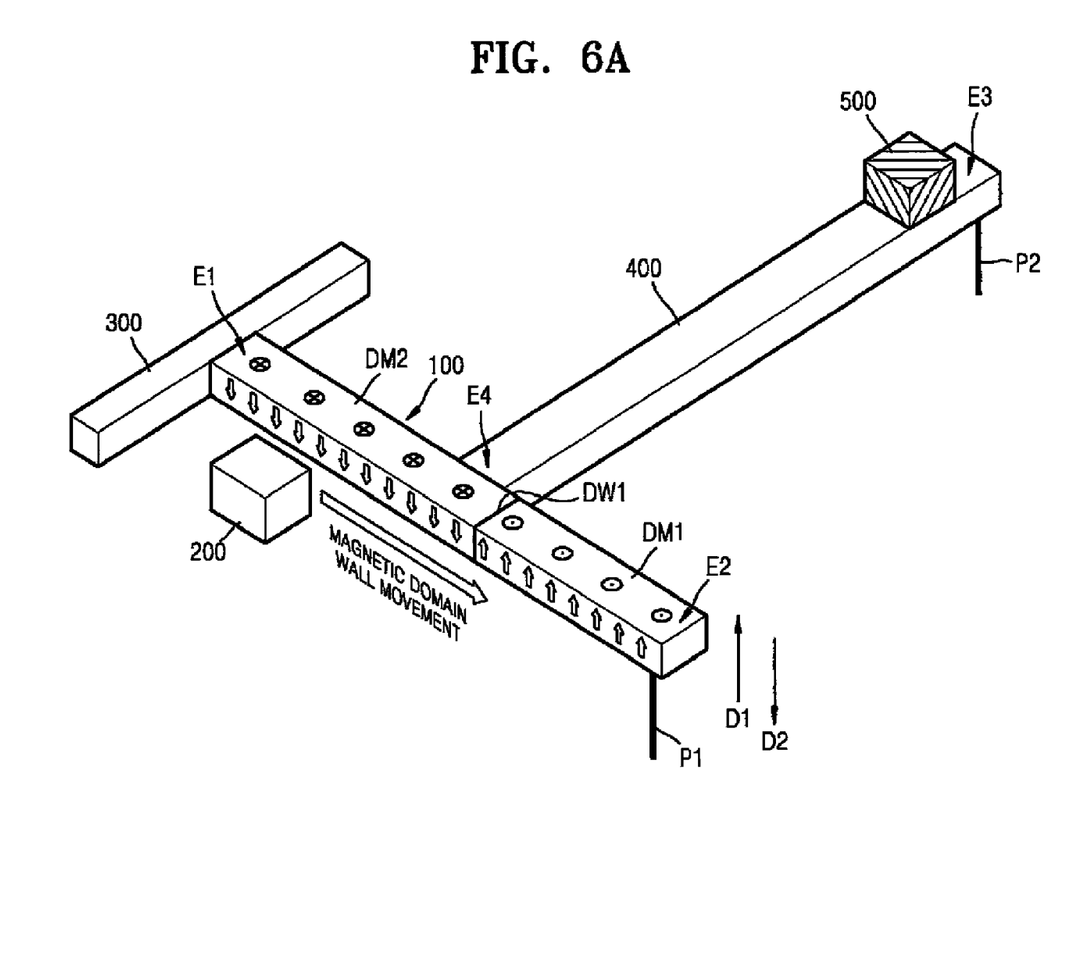
FIGS. 6A through 6D are perspective views for illustrating a method of operating an information storage device according to another example embodiment.

Referring to FIG. 6A, a first magnetic domain wall DW1 may be moved to the end E2 of a first magnetic layer 100 by applying a current from end E2 to end E1 of the first magnetic layer 100. The movement distance of the first magnetic domain wall DW1 may be adjusted according to the intensity of the applied current and application time. In this example, the moved first magnetic domain wall DW1 may be disposed between a binding portion of the first and second magnetic layers 100 and 400 and the end E2 of the first magnetic layer 100. The movement of the first magnetic domain wall DW1 may expand a second magnetic domain DM2.

Figure 6B:
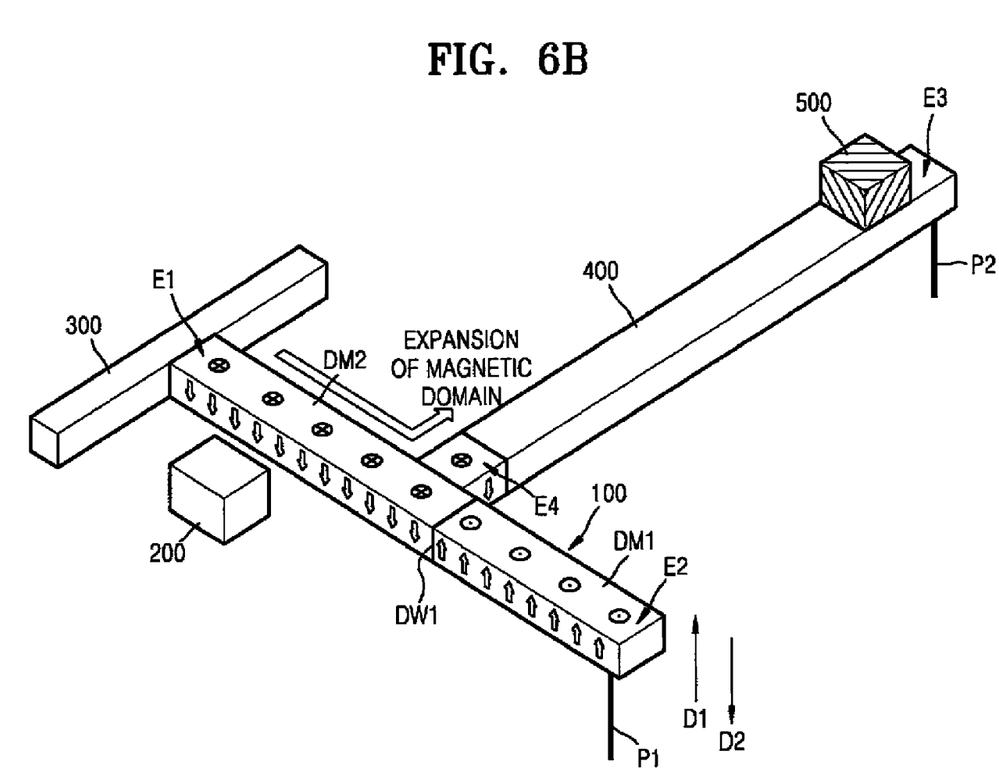

Referring to FIG. 6B, the second magnetic domain DM2 may extend to the other end E4 of the second magnetic layer 400 by applying a current from end E3 of the second magnetic layer 400 to the end E1 of the first magnetic layer 100. In this example, the intensity of the current and application time may be adjusted so that the second magnetic domain DM2 may be extended to a length corresponding to a unit bit. As such, data corresponding to the second magnetic domain DM2 (e.g., '1' or '0') may be written on the other end E4 of the second magnetic layer 400.

Figure 6C:
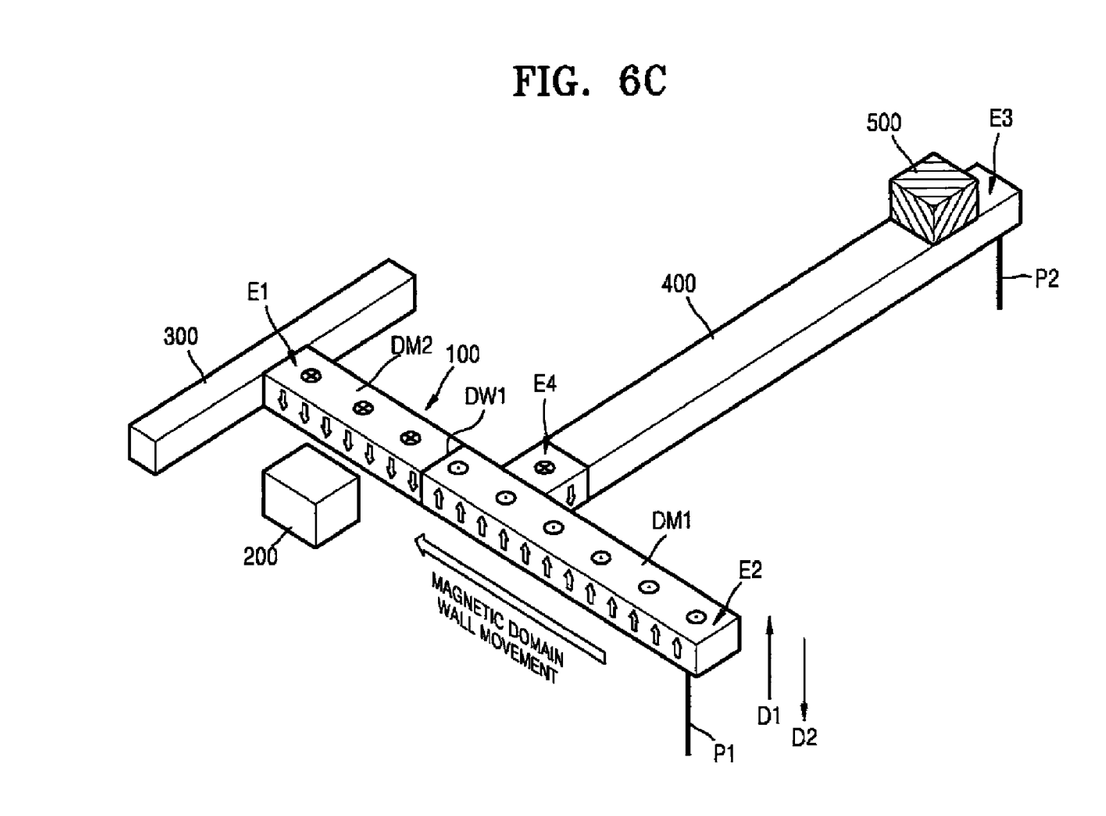

Referring to FIG. 6C, the first magnetic domain wall DW1 may move to the end E1 of the first magnetic layer 100 by applying a current from the end E1 to the other end E2 of the first magnetic layer 100. The first magnetic domain wall DW1 may be arranged between a binding portion of the first and second magnetic layers 100 and 400 and the end E1 of the first magnetic layer 100. The movement of the first magnetic domain wall DW1 may expand a first magnetic domain DM1.

Figure 6D:
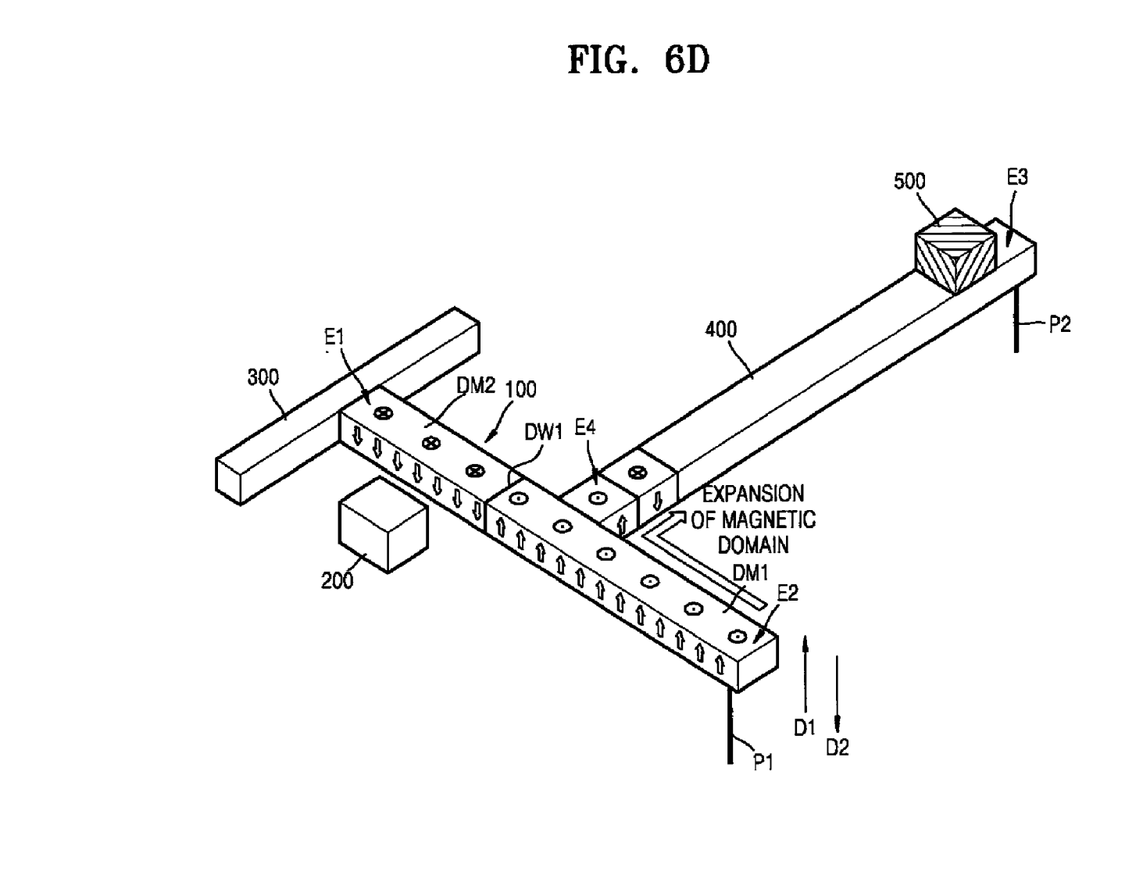

Referring to FIG. 6D, the first magnetic domain DM1 may extend to the other end E4 of the second magnetic layer 400 by applying a current to the other end E2 of the first magnetic layer 100 from the end E3 of the second magnetic layer 400. As such, data corresponding to the first magnetic domain DM1 (e.g., '0' or '1') may be written on the end E4 of the second magnetic layer 400. Data '0' written on the end E4 of the second magnetic layer 400 in FIG. 6B may move to the end E3 of the second magnetic layer 400.

Given information may be written on the second magnetic layer 400 using the example embodiment shown in FIGS. 6A through 6D.

The structure of FIG. 5 may have various alternative structures. An example thereof is shown in FIG. 7.

Figure 7:
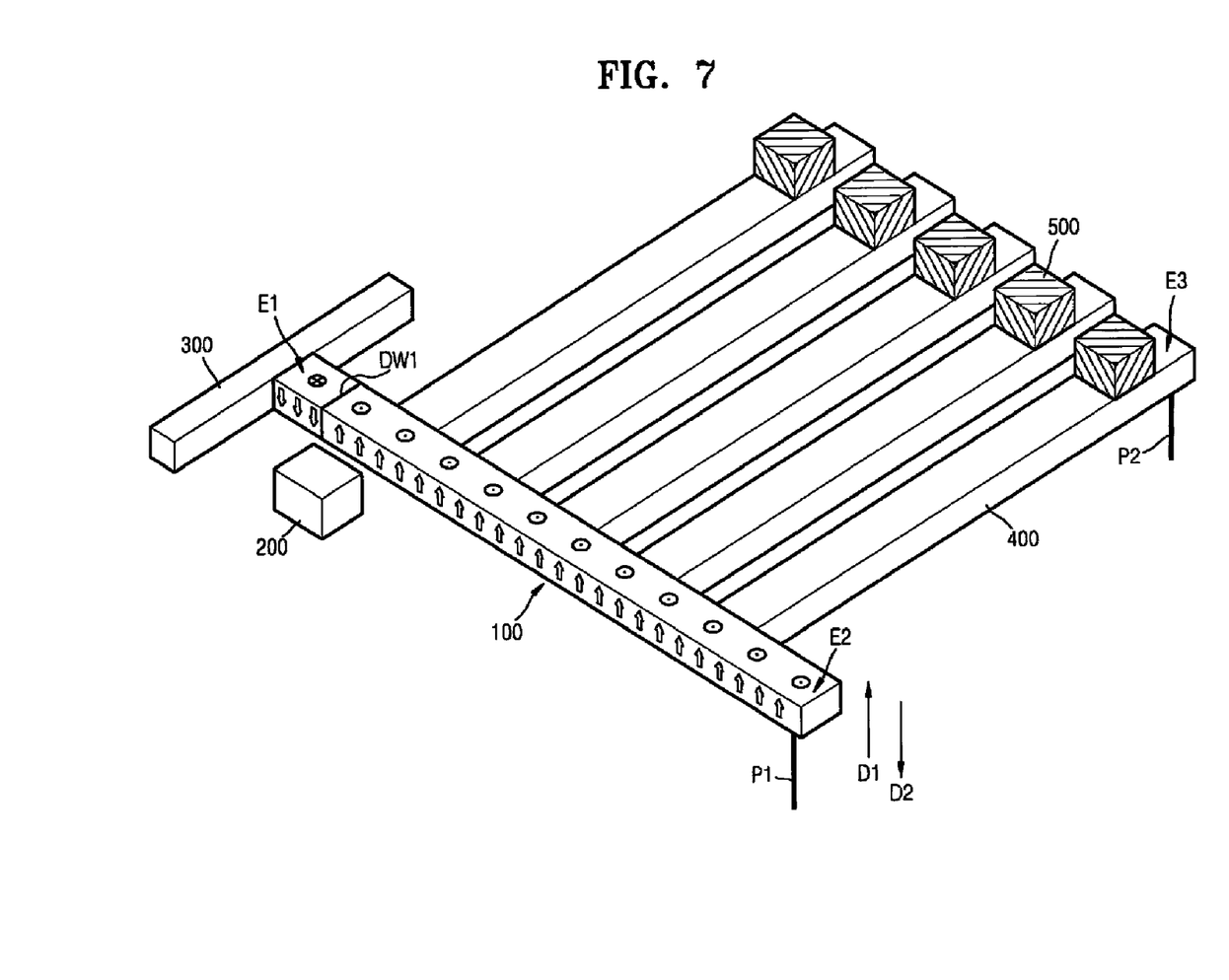
FIG. 7 is a perspective view of an information storage device using magnetic domain wall movement according to another example embodiment.

Referring to FIG. 7, a plurality of second magnetic layers 400 may be formed on a side surface of the first magnetic layer 100. The plurality of second magnetic layers 400 may be provided at equal or substantially equal intervals, and may be parallel to one another. In this example embodiment, the first magnetic layer 100, the heating unit 200, and the conductive line 300 may constitute a common write unit for writing data on the plurality of second magnetic layers 400. After the first magnetic domain wall DW1 is moved to a desired position within the first magnetic layer 100, a current may be applied between a given portion of the second magnetic layer 400 on which data is to be written and the first magnetic layer 100 to write data on the given portion of the second magnetic layer 400. In addition, an information storage device in which at least two or more structures of FIG. 7 are stacked on top of one another at given intervals may be formed.

In a conventional information storage device, a soft magnetic layer is used as a magnetic layer for storing information. In case of the soft magnetic layer, the width of a magnetic domain wall is relatively large and a relatively large amount of current is needed to move the magnetic domain wall. Thus, it is relatively difficult to implement an information storage device having a relatively high recording density and relatively small power consumption using the prior art.

By contrast, information storage devices according to example embodiments utilize a hard magnetic layer. According to example embodiments, the width of the magnetic domain wall existing in the hard magnetic layer may be relatively small (e.g., several nm to several tens of nm) and the density of a current needed in moving the magnetic domain wall of the hard magnetic layer may be smaller than the density of a current needed to move the magnetic domain wall of the soft magnetic layer. In addition, information written on the hard magnetic layer may be more thermally stable as compared to data written on the conventional soft magnetic layer. Thus, according to example embodiments, an information storage device having a higher recording density, smaller power consumption, and/or improved reliability may be realized.

FIGS. 8A through 8D are cross-sectional views for illustrating a method of manufacturing information storage devices according to example embodiments.

Figure 8A:
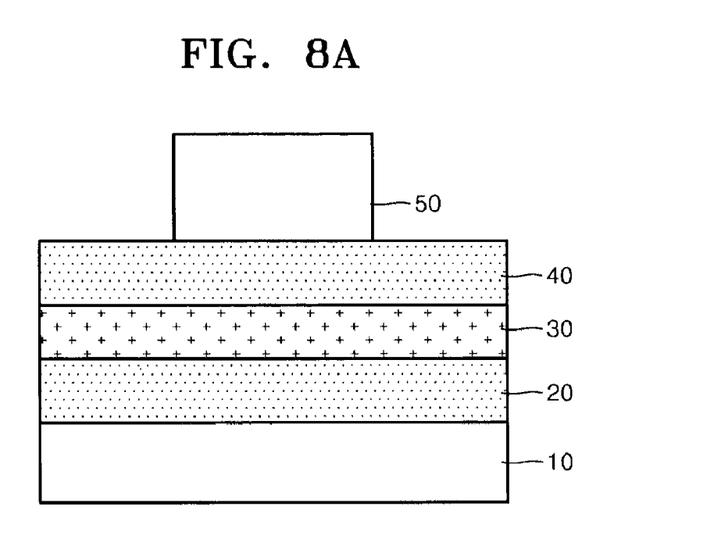
FIGS. 8A through 8D are cross-sectional views for illustrating a method of manufacturing an information storage device according to another example embodiment.

Referring to FIG. 8A, a first reflection layer (e.g., an n-type distributed Bragg reflection (DBR) layer) 20, an active layer 30, and a second reflection layer (e.g., p-type DBR layer) 40 may be formed sequentially on a substrate 10. Positions at which the first reflection layer 20 and the second reflection layer 40 are to be formed may be changed. A transparent insulating layer pattern 50 may be formed on the second reflection layer 40. The transparent insulating layer pattern 50 may be formed of a transparent insulating material such as a silicon oxide or the like.

Figure 8B:
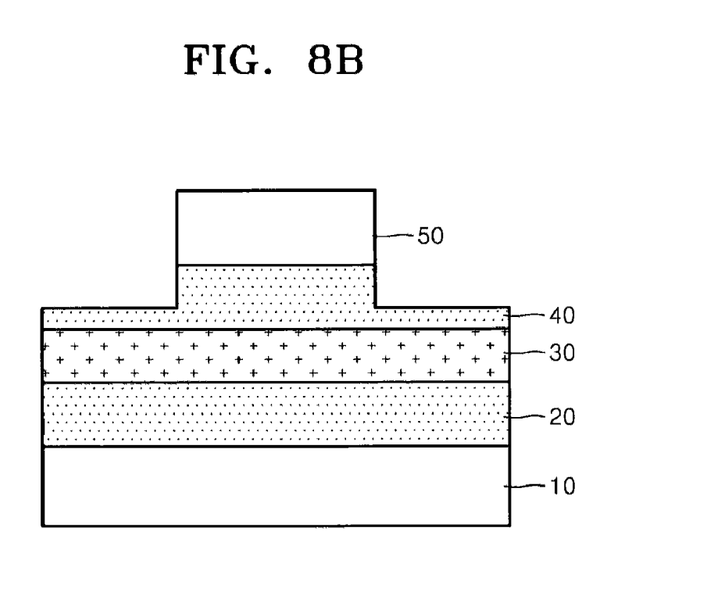

The second reflection layer 40 may be etched to a given thickness using the transparent insulating layer pattern 50 as an etch mask. An example result of the etching is shown in FIG. 8B. During etching, the transparent insulating layer pattern 50 may be at least partially etched.

An oxidation process may be performed on an exposed portion of the second reflection layer 40 on which the transparent insulating layer pattern 50 is not formed, and also on the active layer 30 below the second reflection layer 40. An example, resultant structure of the oxidation process is shown in FIG. 8C.

Figure 8C:
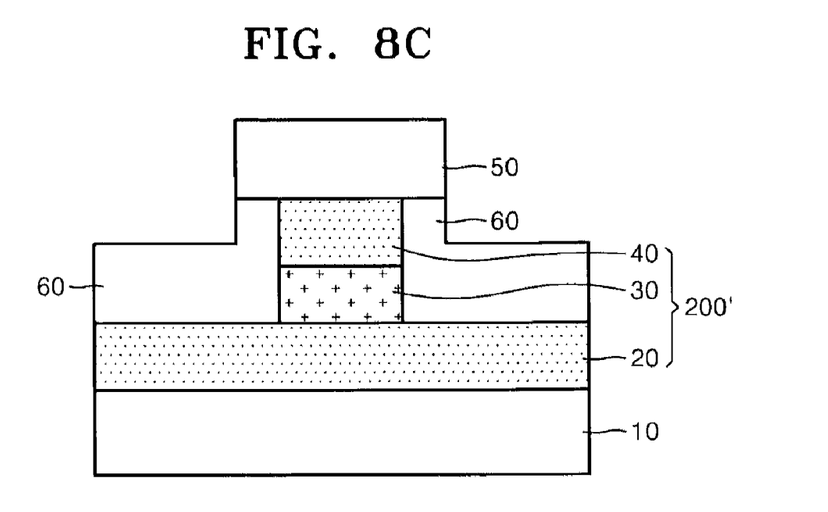

Referring to FIG. 8C, the oxidation process may form an oxide layer 60 around the transparent insulating layer pattern 50. The oxide layer 60 may be expanded (e.g., slightly expanded) to a lower portion of the transparent insulating layer pattern 50. The oxide layer 60 may define a device region. In this example, the first reflection layer 20, the active layer 30, and the second reflection layer 40 may constitute a light source 200' having a laser diode (LD) structure. The light source 200' may correspond to the heating unit 200 of FIG. 1, but may be replaced with a light source having an alternative structure other than an LD structure. For example, the light source 200' may be a light emitting diode (LED) structure.

Figure 8D:
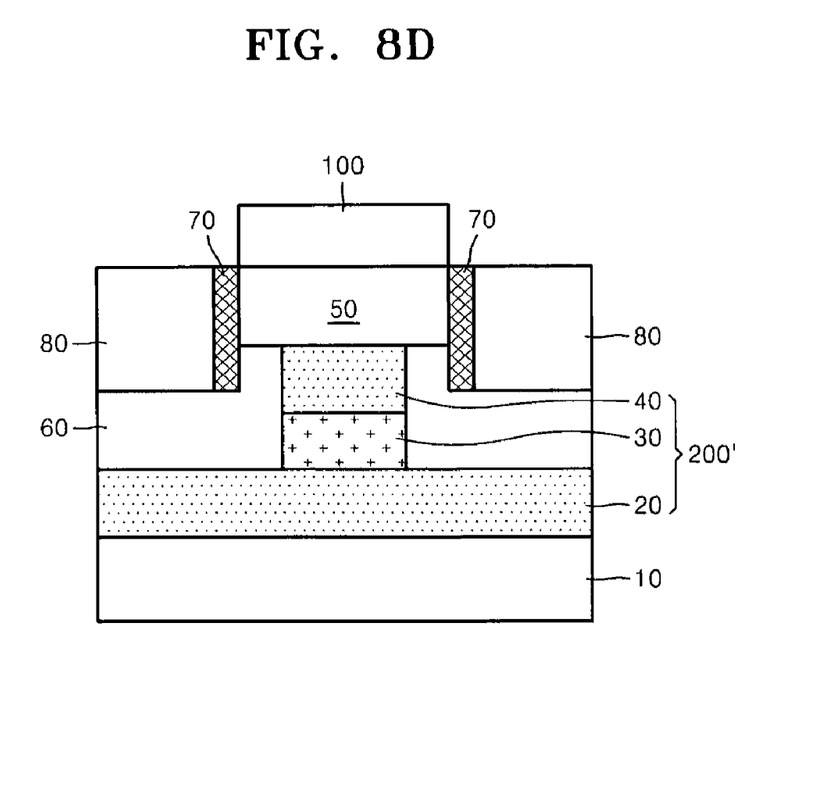

Referring to FIG. 8D, a light shielding wall 70 may be formed on a side surface of the transparent insulating layer pattern 50 and on a side surface of the oxide layer 60 below the transparent insulating layer pattern 50. The light shielding wall 70 may be rectangular or similar frame-shaped when seen from the above. The light shielding wall 70 may be formed of an opaque insulating material. The light shielding wall 70 may at least partially surround at least part of the light source 200'. Alternatively, the light shielding wall 70 may not surround the light source 200'. An inter-level dielectric (ILD) layer 80 may be formed on the oxide layer 60 around the light shielding wall 70. The ILD layer 80 may be formed at the same or substantially the same height as the light shielding wall 70. A first magnetic layer 100 may be formed on the transparent insulating layer pattern 50. A portion of the first magnetic layer 100 may be heated by light generated by the light source 200'. Although not shown in FIG. 8D, a magnetic field applying unit may be formed adjacent to a side surface of the first magnetic layer 100 (e.g., a conductive line), and a second magnetic layer for storing information connected to the first magnetic layer 100 may be formed.

While example embodiments have been particularly shown and described with reference to the drawings, it will be understood by one of ordinary skill in the art that various changes in form and details may be made therein without departing from the spirit and scope of the present invention as defined by the appended claims.

For example, it will be understood by one of ordinary skill in the art that the structures of FIGS. 1 through 3 and FIGS. 5 and 7 may be modified in various shapes and the methods of manufacturing information storage devices of FIGS. 8A through 8D may be modified in various shapes. As an example, an information storage device including a soft magnetic intermediate layer formed on a middle portion of the first magnetic layer 100 and a ferromagnetic storage layer formed on at least one side surface of the soft magnetic intermediate layer may be realized. Therefore, the scope of the present invention is defined not by the detailed description of the present invention but by the appended claims, and all differences within the scope will be construed as being included in the present invention.

What is claimed is:

1. An information storage device comprising:
 a first magnetic layer;
 a heating unit configured to heat a first region of the first magnetic layer; and
 a magnetic field applying unit configured to form a magnetic domain by applying a magnetic field to the first region; wherein
 a wall of the magnetic domain is moved by a current applied to the first magnetic layer.

2. The information storage device of claim 1, wherein the first magnetic layer has perpendicular magnetic anisotropy.

3. The information storage device of claim 1, wherein the heating unit is a light source configured to radiate light on the first region.

4. The information storage device of claim 3, further comprising:
 a light shielding wall arranged between the light source and the first region of the first magnetic layer, the light shielding wall being configured to shield laterally-emitted light from the light source.

5. The information storage device of claim 1, wherein the first region is a first end of the first magnetic layer.

6. The information storage device of claim 5, wherein the magnetic field applying unit is a conductive line spaced apart from the first end.

7. The information storage device of claim 5, further comprising:
 an electrode connected to each of the first end and a second end of the first magnetic layer, the current for moving the wall of the magnetic domain being applied to the first magnetic layer through the electrodes.

8. The information storage device of claim 5, wherein the magnetic field applying unit is a conductive line contacting a side surface of the first end.

9. The information storage device of claim 1, wherein the magnetic field applying unit is a conductive line connected to a first end of the first magnetic layer, the device further comprising:

an electrode connected to a second end of the first magnetic layer, the current for moving the wall of the magnetic domain being applied to the first magnetic layer through the conductive line and the electrode.

10. The information storage device of claim 1, further comprising:
at least one second magnetic layer connected to the first magnetic layer, the at least one second magnetic layer being configured to store information.

11. The information storage device of claim 10, wherein the at least one second magnetic layer includes,
a plurality of second magnetic layers arranged perpendicular to the first magnetic layer.

12. The information storage device of claim 11, wherein the plurality of second magnetic layers are connected to a same side of the first magnetic layer, the plurality of second magnetic layers being spaced apart from one another by a first interval.

13. The information storage device of claim 1, wherein the heating unit and the magnetic field applying unit constitute a writing unit configured to write data to the first magnetic layer.

14. A method of operating an information storage device including a first magnetic layer, a heating unit configured to heat a first region of the first magnetic layer, and a magnetic field applying unit configured to form a magnetic domain by applying a magnetic field to the first region, wherein a wall of the magnetic domain is moved by a current applied to the first magnetic layer, the method comprising:
heating the first region of the first magnetic layer; and
forming the magnetic domain by applying the magnetic field to the heated first region.

15. The method of claim 14, wherein the first magnetic layer has perpendicular magnetic anisotropy.

16. The method of claim 14, wherein the heating of the first region includes,
radiating light at the first region.

17. The method of claim 14, wherein the first region is a first end of the first magnetic layer.

18. The method of claim 14, further comprising:
moving a wall of the magnetic domain by applying the current to the first magnetic layer.

19. The method of claim 14, further comprising:
storing information in at least one second magnetic layer, the at least one second magnetic layer being connected to the first magnetic layer.

20. The method of claim 19, further comprising:
expanding a magnetic domain of the first magnetic layer to the second magnetic layer by applying a current from the second magnetic layer to the first magnetic layer.

21. The method of claim 20, further comprising:
moving a wall of the magnetic domain within the first magnetic layer after expanding the magnetic domain of the first magnetic layer.

22. The method of claim 14, wherein the heating and the forming are performed to write data to the first region of the first magnetic layer.

23. A method of manufacturing an information storage device comprising:
forming a light source on a substrate;
forming a transparent insulating layer pattern on the light source;
forming a light shielding wall surrounding a side surface of the transparent insulating layer pattern; and
forming a first magnetic layer on the transparent insulating layer.

24. The method of claim 23, wherein the light shielding wall is formed to at least partially surround the light source.

* * * * *